United States Patent
Gui et al.

(10) Patent No.: US 10,615,193 B2
(45) Date of Patent: Apr. 7, 2020

(54) ARRAY SUBSTRATE, METHOD FOR MANUFACTURING THE SAME, DISPLAY PANEL, AND DISPLAY DEVICE

(71) Applicants: Beijing BOE Display Technology Co., Ltd., Beijing (CN); BOE Technology Group Co., Ltd., Beijing (CN)

(72) Inventors: Bingqiang Gui, Beijing (CN); Lianjie Qu, Beijing (CN); Yonglian Qi, Beijing (CN); Hebin Zhao, Beijing (CN); Xiaogai Chun, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/080,207

(22) PCT Filed: Jan. 31, 2018

(86) PCT No.: PCT/CN2018/074680
§ 371 (c)(1),
(2) Date: Aug. 27, 2018

(87) PCT Pub. No.: WO2019/010960
PCT Pub. Date: Jan. 17, 2019

(65) Prior Publication Data
US 2019/0348449 A1    Nov. 14, 2019

(30) Foreign Application Priority Data
Jul. 12, 2017  (CN) .......................... 2017 1 0565410

(51) Int. Cl.
*H01L 27/14*  (2006.01)
*H01L 27/12*  (2006.01)
(Continued)

(52) U.S. Cl.
CPC ........ *H01L 27/1274* (2013.01); *H01L 21/223* (2013.01); *H01L 21/477* (2013.01); *H01L 27/1225* (2013.01); *H01L 27/1237* (2013.01)

(58) Field of Classification Search
CPC ............... H01L 27/127; H01L 27/1274; H01L 27/1225; H01L 27/1237
See application file for complete search history.

(56) References Cited

U.S. PATENT DOCUMENTS

2003/0194839 A1* 10/2003 Chung .............. H01L 29/66772
                                                         438/151
2004/0016924 A1    1/2004 Yamada et al.
(Continued)

FOREIGN PATENT DOCUMENTS

CN          1770393        5/2006
CN          104538352      4/2015
(Continued)

OTHER PUBLICATIONS

International Search Report and Written Opinion of the International Searching Authority corresponding to International Patent Application No. PCT/CN2018/074680, dated May 2, 2018. (15 pages including English language translation).

*Primary Examiner* — Phuc T Dang
(74) *Attorney, Agent, or Firm* — Myers Bigel, P.A.

(57) ABSTRACT

An array substrate, a method for manufacturing the same, a display panel, and a display device are provided. In the method for manufacturing an array substrate provided by an embodiment of the present disclosure, the annealing process for the first active layer in the pixel area is performed by a high temperature required in the dehydrogenation process for the second active layer in the peripheral area.

16 Claims, 5 Drawing Sheets

(51) Int. Cl.
*H01L 21/223* (2006.01)
*H01L 21/477* (2006.01)

(56) References Cited

U.S. PATENT DOCUMENTS

| | | | | |
|---|---|---|---|---|
| 2006/0079033 | A1* | 4/2006 | Machida | H01L 21/0242 438/149 |
| 2012/0256185 | A1* | 10/2012 | Nakamura | H01L 21/02422 257/59 |
| 2015/0053935 | A1 | 2/2015 | Gupta et al. | |
| 2016/0141425 | A1* | 5/2016 | Sun | H01L 27/124 257/72 |

FOREIGN PATENT DOCUMENTS

| | | |
|---|---|---|
| CN | 105408813 | 3/2016 |
| CN | 106449653 | 2/2017 |

\* cited by examiner

ARRAY SUBSTRATE, METHOD FOR MANUFACTURING THE SAME, DISPLAY PANEL, AND DISPLAY DEVICE

CROSS REFERENCE TO RELATED APPLICATIONS

The present application is a 35 U.S.C. 371 national stage application of PCT International Application No. PCT/CN2018/074680, filed on Jan. 31, 2018 which claims the benefit of Chinese Patent Application No. 201710565410.4 filed on Jul. 12, 2017, the contents of both of which are incorporated herein by reference in their entireties.

TECHNICAL FIELD

The present disclosure generally relates to the field of display technologies, and specifically to an array substrate, a method for manufacturing the same, a display panel and a display device.

BACKGROUND

Thin film transistors (TFTs) in display devices are mainly classified into two types. One type of TFTs are located in an active area (AA) (which may also be referred to as a pixel area) and configured to control display of the pixel area, which are thus generally called pixel TFTs. The other type of TFTs are located on the periphery of the active area and configured to drive the gate lines, which are thus generally called peripheral TFTs.

Generally speaking, the peripheral TFTs need to have characteristics such as high switching speed, high driving current, and the like, thus low-temperature polysilicon (LTPS) TFTs are more feasible. In contrast, the pixel TFTs are generally characterized by low leakage current, good uniformity, and the like, thus oxide TFTs are more desirable.

In a conventional display device, only single-type TFTs are usually employed, so it is difficult to satisfy the characteristic requirements on the above two types of TFTs simultaneously.

SUMMARY

According to an aspect of the present disclosure, there is provided a method for manufacturing an array substrate, comprising: forming a first thin film transistor in a pixel area on a substrate, and forming a second thin film transistor in a peripheral area on the substrate surrounding the pixel area. Forming a first thin film transistor in a pixel area on a substrate specifically comprises forming a first semiconductor layer, and performing an annealing process to the first semiconductor layer to form a first active layer of the first thin film transistor. Forming a second thin film transistor in a peripheral area on the substrate surrounding the pixel area specifically comprises forming a semiconductor material layer, performing a dehydrogenation process to the semiconductor material layer to form a second semiconductor layer, and processing the second semiconductor layer to form a second active layer of the second thin film transistor. In the above manufacturing method, the first semiconductor layer is formed prior to the second semiconductor layer, and the dehydrogenation process and the annealing process are performed simultaneously.

According to some embodiments of the present disclosure, processing the second semiconductor layer to form a second, active layer of the second thin film transistor comprises: performing patterning, channel doping and ion implantation for the second semiconductor layer to form a second active layer of the second thin film transistor.

According to some embodiments of the present disclosure, prior to forming the first semiconductor layer, the above manufacturing method for an array substrate further comprises: forming, on the substrate, a light shielding layer including a first light shielding portion and a second light shielding portion, an orthographic projection of the first active layer on the substrate overlapping an orthographic projection of the first light shielding portion on the substrate, and an orthographic projection of the second active layer on the substrate overlapping an orthographic projection of the second light shielding portion on the substrate; and forming a first buffer layer covering the light shielding layer.

According to some embodiments of the present disclosure, prior to forming the second semiconductor layer, the above manufacturing method for an array substrate further comprises forming a second buffer layer covering the first semiconductor layer.

According to some embodiments of the present disclosure, after forming the second active layer, the above manufacturing method for an array substrate further comprises: forming a gate insulating layer covering the second active layer; forming a first gate and a second gate on the gate insulating layer, an orthographic projection of the first gate on the substrate overlapping an orthographic projection of the first active layer on the substrate, an orthographic projection of the second gate on the substrate overlapping an orthographic projection of the second active layer on the substrate; and forming an interlayer dielectric layer covering the first gate and the second gate.

According to some embodiments of the present disclosure, after forming the interlayer dielectric layer, the above manufacturing method for an array substrate further comprises: forming a first source/drain and a second source/drain on the interlayer dielectric layer, the first source/drain being connected to the first active layer through a first via hole, and the second source/drain being connected to the second active layer through a second via hole.

According to some embodiments of the present disclosure, the above manufacturing method for an array substrate further comprises: forming a planarization layer, a common electrode, a passivation layer, and a pixel electrode successively on the first source/drain and the second source/drain.

According to some embodiments of the present disclosure, the first thin film transistor is, a top gate type thin film transistor.

According to some embodiments of the present disclosure, the first active layer includes an oxide semiconductor material, and the second active layer includes low-temperature polysilicon.

According to another aspect of the present disclosure, there is provided an array substrate comprising: a substrate, a first thin film transistor disposed in a pixel area on the substrate, and a second thin film transistor disposed in a peripheral area on the substrate surrounding the pixel area. The first thin film transistor includes a first active layer formed using an annealing process, the second thin film transistor includes a second active layer formed using a dehydrogenation process, and the dehydrogenation process and the annealing process are performed simultaneously.

According to some embodiments of the present disclosure, the first active layer and the second active layer are located in a same layer.

According to some embodiments of the present disclosure, the above array substrate further comprises a light shielding layer located between the substrate and the first active layer. The light shielding layer includes a first light shielding portion and a second light shielding portion, wherein an orthographic projection of the first active layer on the substrate overlaps an orthographic projection of the first light shielding portion on the substrate, and an orthographic projection of the second active layer on the substrate overlaps an orthographic projection of the second light shielding portion on the substrate.

According to some embodiments of the present disclosure, the above array substrate further comprises a first buffer layer located between the light shielding layer and the first active layer.

According to some embodiments of the present disclosure, the first active layer is closer to the substrate than the second active layer, and the array substrate further comprises a second buffer layer that is located between the first active layer and the second active layer and covers the first active layer.

According to some embodiments of the present disclosure, the above array substrate further comprises: a gate insulating layer located above the second active layer; a first gate and a second gate located on a side of the gate insulating layer away from the substrate, an orthographic projection of the first gate on the substrate overlapping an orthographic projection of the first active layer on the substrate, an orthographic projection of the second gate on the substrate overlapping an orthographic projection of the second active layer on the substrate; an interlayer dielectric layer covering the first gate and the second gate; a first source/drain and a second source/drain located on the interlayer dielectric layer, the first source/drain being connected to the first active layer through a first via hole, the second source/drain being connected to the second active layer through a second via hole; and a planarization layer, a common electrode, a passivation layer, and a pixel electrode disposed successively on the first source/drain and the second source/drain, the pixel electrode being connected to the first source/drain through a third via hole.

According to a further aspect of the present disclosure, there is provided a display panel comprising any of the array substrates as described above.

According to yet another aspect of the present disclosure, there is provided a display device comprising any of the display panels as described above.

DETAILED DESCRIPTION OF EMBODIMENTS

Figure 1:
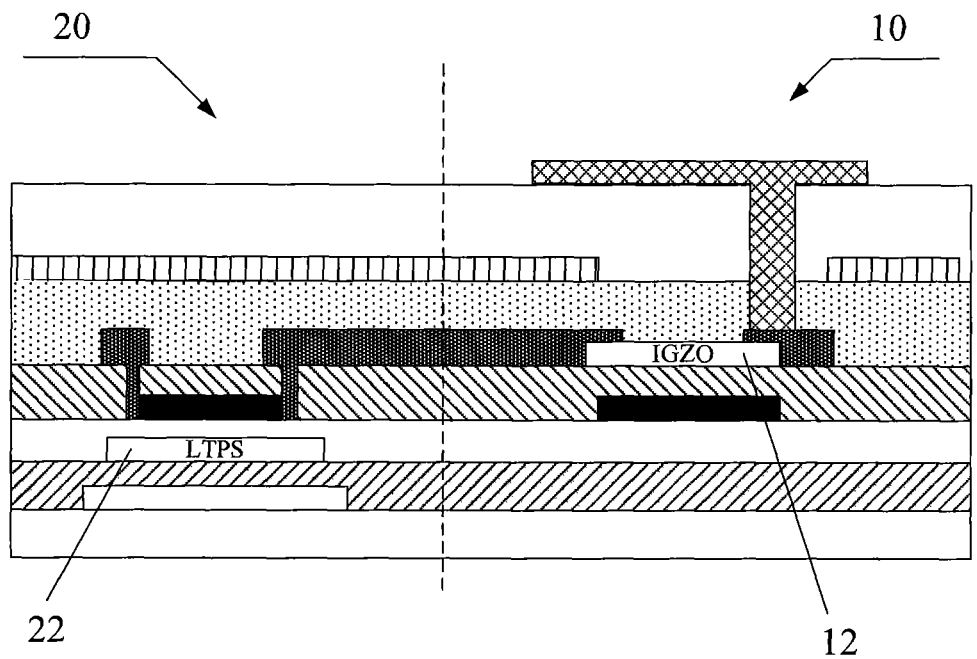
FIG. 1 is a schematic sectional view of a typical array substrate.

To enable those skilled in the art to have better understanding of the technical solutions of the present disclosure, it will be further described in detail below in conjunction with the accompanying drawings and specific embodiments.

In the drawings, the following reference numerals are used:

10—substrate; 11—pixel area; 12—peripheral area; 21—first active layer; 21'—first semiconductor layer; 22—second active layer; 31—first light shielding portion; 32—second light shielding portion; 41—first buffer layer; 42—second buffer layer; 50—gate insulating layer; 51—first gate; 52—second gate; 60—interlayer dielectric layer; 61—first source/drain; 62—second source/drain; 71—planarization layer; 72—common electrode; 73—passivation layer; 74—pixel electrode.

FIG. 1 schematically shows a sectional view of a typical array substrate. As shown in FIG. 1, the array substrate comprises a pixel area 10 and a peripheral area 20 around the pixel area 10. In the pixel area 10, an oxide (for example, indium gallium zinc oxide IGZO) TFT is used as a pixel TFT, and the pixel TFT may have a bottom gate structure. In the peripheral area 20, a low-temperature polysilicon type TFT is used as a peripheral TFT, and the peripheral TFT may have a top gate structure.

As used herein, the term "top gate structure" means an active layer of a TFT is located on a side of the gate closer to the substrate, and the term "bottom gate structure" means an active layer of a TFT is located on a side of the gate away from the substrate.

The inventors have found that, although the array substrate shown in FIG. 1 can combine the advantages of the two types of TFTs to thereby improve the display performance of the display panel, there are many problems with this solution. Firstly, since the active layer 12 of the pixel TFT in the pixel area 10 is made of an oxide (specifically, indium gallium zinc oxide IGZO), in order to increase the field effect mobility of the prepared TFT to improve the performance thereof, the active layer 12 needs to be subjected to an annealing process during production. However, the active layer 22 of the peripheral TFT in the peripheral area 20 is composed of an LTPS material and has been doped at that time, thus the high temperature in the annealing process for the active layer 12 may be detrimental to the performance of the doped LTPS material, so that the doping effect of the active layer 22 of the peripheral TFT is muted. Secondly, since the pixel TFT adopts a back channel etching (BCE) type structure, the channel of the oxide active layer 12 may be damaged to some extent when the source/drain is being etched.

Figure 2:
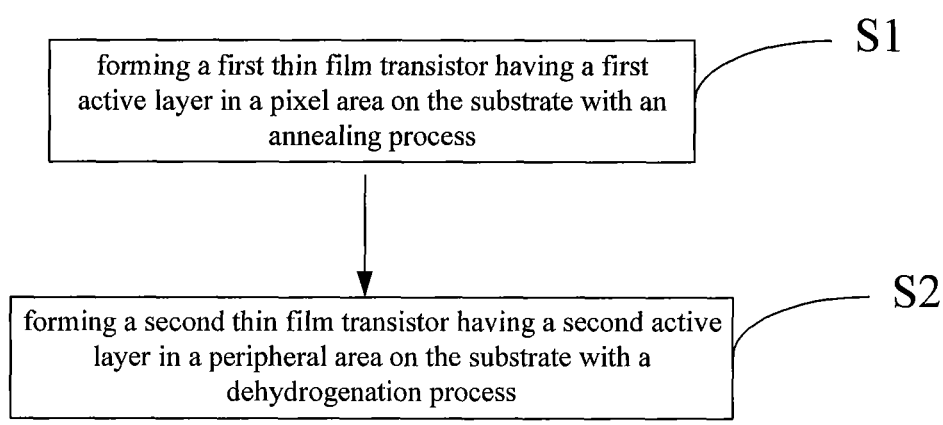
FIG. 2 is a flowchart of a manufacturing method for an array substrate according to an embodiment of the present disclosure.

In view of the above, an embodiment of the present disclosure provides a manufacturing method for an array substrate. As shown in FIG. 2, the manufacturing method comprises, at step S1, forming a first thin film transistor in a pixel area on a substrate. The manufacturing method further comprises, at step S2, forming a second thin film transistor in a peripheral area on the substrate. Specifically, step S1 may include forming a first semiconductor layer, and performing an annealing process to the first semiconductor layer to form a first active layer of the first thin film transistor. Step S2 may specifically include forming a semiconductor material layer, performing a dehydrogenation process to the semiconductor material layer to form a second semiconductor layer, and processing the second semiconductor layer to form a second active layer of the second thin film transistor. In particular, the first semiconductor layer is formed prior to the second semiconductor layer, and the dehydrogenation process and the annealing process are performed simultaneously.

As used herein, the term "first semiconductor layer" refers to a state of the first active layer before the annealing process, the term "semiconductor material layer" refers to a state of the second semiconductor layer before the dehydrogenation process, and the term "second semiconductor layer" refers to a state of the second active layer before it is subjected to processing (e.g., patterning, channel doping and ion implantation). In particular, in embodiments of the present disclosure, the materials of the semiconductor material layer and the second semiconductor layer may be different, but the material of the second semiconductor layer is the same as that of the second active layer.

In the manufacturing method for an array substrate according to this embodiment, since the annealing process for the first semiconductor layer in the pixel area is performed simultaneously with the dehydrogenation process for the second semiconductor layer in the peripheral area, a high temperature is also necessary for the dehydrogenation process, the annealing process for the first semiconductor layer does not adversely affect the performance of the second semiconductor layer. Moreover, the manufacturing method of this embodiment is simple in process and easy to operate, which is thus suitable for line production in the industry.

Figure 3:
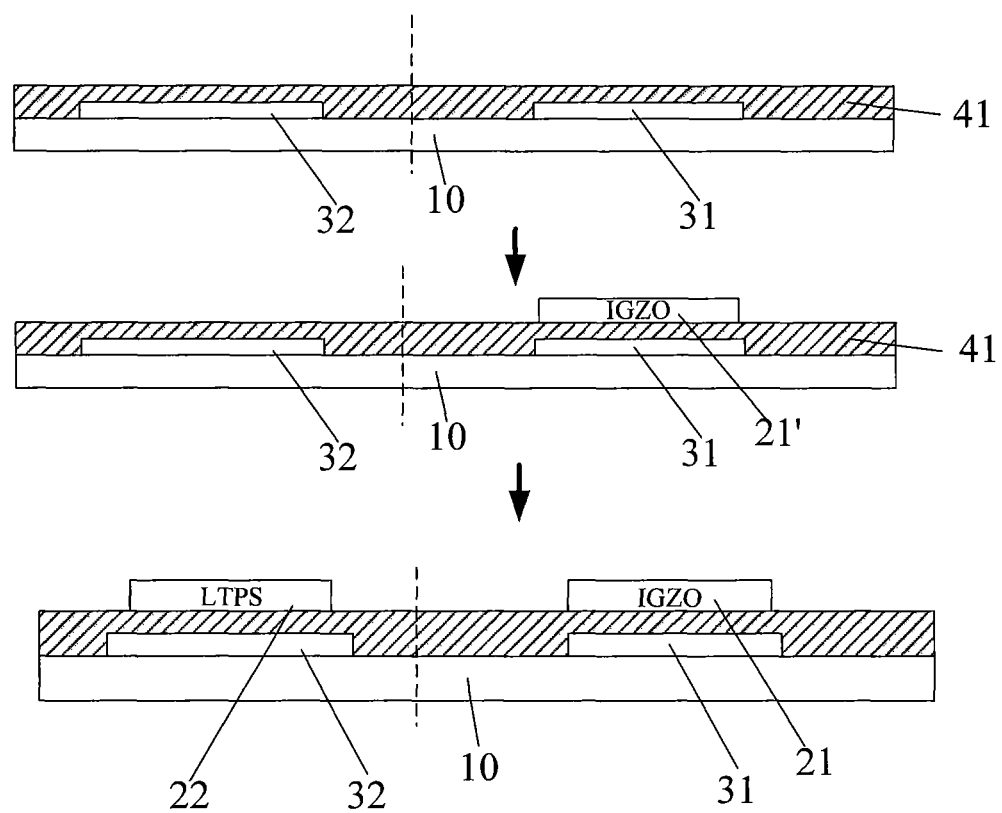
FIG. 3 schematically shows steps of a manufacturing method for an array substrate according to an embodiment of the present disclosure.

FIG. 3 schematically shows steps of the manufacturing method for an array substrate according to an embodiment of the present disclosure. As shown in FIG. 3, firstly, a light shielding material is deposited on the substrate 10, which is patterned to form a first light shielding portion 31 and a second light shielding portion 32. The light shielding material may be an organic material that does not transmit light, or a metal or alloy that has high reflectivity and low transmittance, such as Al, Mo, Cu, a Cu/Al alloy, or the like. In some embodiments, the light shielding material may have a thickness of 20 to 200 nm. A buffer material is deposited on the first light shielding portion 31 and the second light shielding portion 32 to form a first buffer layer 41 covering the first light shielding portion 31 and the second light shielding portion 32. The buffer material may include $SiN_x$ or $SiO_2$, and the first buffer layer 41 may be a single layer structure or a multilayer structure. In some exemplary embodiments, the first buffer layer 41 may have a thickness of 20 to 200 nm. Particularly, the first light shielding portion 31 is located in the pixel area of the array substrate to be prepared, and the second light shielding portion 32 is located in the peripheral area of the array substrate to be prepared.

When the above array substrate is applied in a display device with a backlight source, the first light shielding portion 31 and the second light shielding portion 32 can shield light from the backlight source so as to prevent degradation of the active layer formed later due to illumination. However, as will be appreciated by those skilled in the art, the first light shielding portion 31 and the second light shielding portion 32 may be omitted in some embodiments.

Next, an IGZO material is deposited on the first buffer layer 41, which is subjected to patterning, channel doping and ion implantation to form a first semiconductor layer 21'. The first semiconductor layer 21' is located in the pixel area of the array substrate to be prepared. In some exemplary embodiments, the first semiconductor layer 21' may have a thickness of 20 to 200 nm.

Next, a second active layer 22 is formed on the first buffer layer 41, and the first semiconductor layer 21' is subjected to an annealing process to form a first active layer 21. The second active layer 22 is located in the peripheral area of the array substrate to be prepared.

In an exemplary embodiment, the step of forming the second active layer 22 may specifically include firstly depositing amorphous silicon (a-Si) on the first buffer layer 41 to form a semiconductor material layer. The semiconductor material layer may have a thickness of 20-200 nm. Then, the semiconductor material layer is subjected to a dehydrogenation process and laser crystallization (ELA) to convert the a-Si in the semiconductor material layer into polysilicon (P-Si), thereby forming a second semiconductor layer. The second semiconductor layer is subjected to patterning, channel doping and ion implantation to form the second active layer 22.

If the semiconductor material layer is not subjected to a dehydrogenation process, the a-Si will instantaneously absorb a large amount of laser energy during laser crystallization. The laser energy will cause hydrogen contained in the a-Si to explode, which in turn results in ablation of the a-Si.

As will be appreciated by those skilled in the art, in embodiments of the present disclosure, it is also feasible to form P-Si by chemical vapor deposition or solid phase crystallization, etc., without being limited to laser crystallization.

Further, while the semiconductor material layer is subjected to a dehydrogenation process, an annealing process is performed on the first semiconductor layer 21' in the pixel area by the high temperature required by the dehydrogenation process to form the first active layer 21 that satisfies the performance requirements on a pixel TFT.

In the embodiments described above, the first semiconductor layer 21' is formed prior to the second semiconductor layer, and the annealing process for the first semiconductor layer 21' is performed while the second semiconductor layer is subjected to high temperature dehydrogenation, so as to form the first active layer 21. In this way, the annealing process for the first semiconductor layer 21' does not adversely affect the performance of the second semiconductor layer, which is advantageous to the channel doping effect of the second thin film transistor to be formed later. In an exemplary embodiment, high temperature dehydrogenation may be carried out at 350-650° C. for 20-60 minutes. After the dehydrogenation process, H content in the a-Si can be less than 2%.

Figure 4:
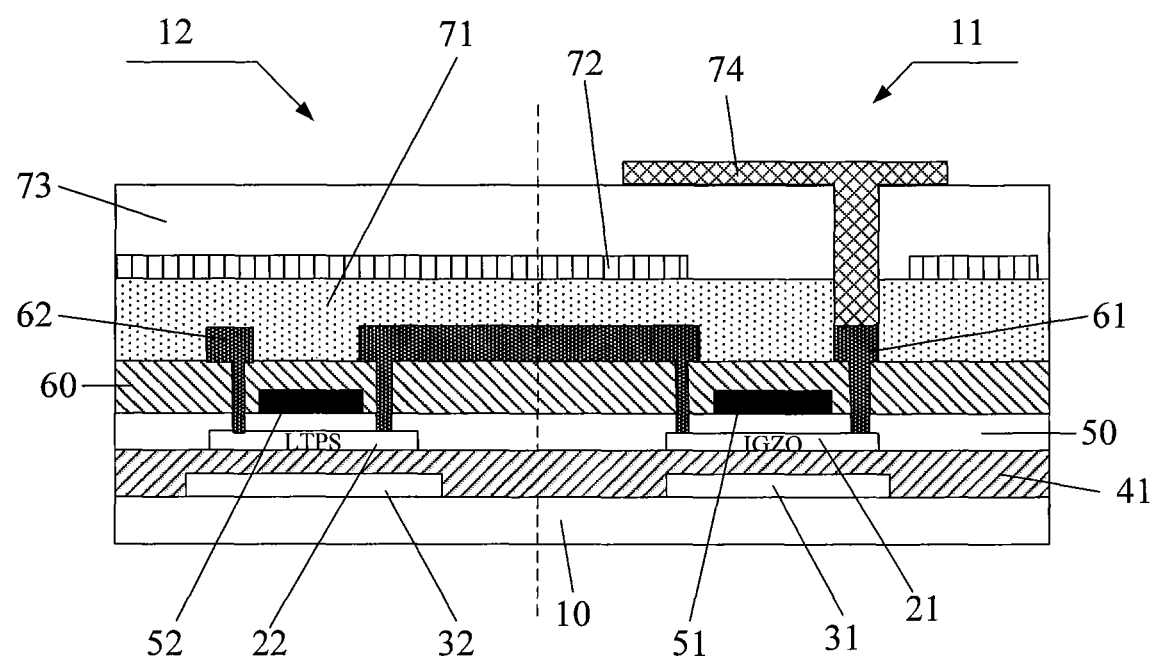
FIG. 4 schematically shows steps of a manufacturing method for an array substrate according to another embodiment of the present disclosure.

FIG. 4 illustrates a schematic sectional view of an array substrate prepared by the manufacturing method shown in FIG. 3. As shown in FIG. 4, the prepared array substrate comprises a substrate 10, a first thin film transistor disposed in a pixel area 11 on the substrate 10, and a second thin film transistor in a peripheral area 12 on the substrate 10. The first thin film transistor includes a first active layer 21 formed by an annealing process, and the second thin film transistor includes a second active layer 22 formed by a dehydrogenation process. The dehydrogenation process and the annealing process are simultaneously performed.

The array substrate includes two types of TFTs, in which a low-temperature polysilicon TFT (i.e., second thin film transistor) is disposed in the peripheral area 12, and an oxide TFT (i.e., first thin film transistor) is disposed in the pixel area 11. Since the annealing process for forming the first active layer 21 in the pixel area 11 is performed by a high temperature step in the dehydrogenation process for forming the second active layer 22 in the peripheral area 12, the annealing process does not adversely affect the performance of the second active layer 22.

Optionally, as shown in FIG. 4, the first thin film transistor in the pixel area 11 may be a top gate type thin film transistor. The first active layer 21 of the top gate type thin film transistor is closer to the substrate 10, so that the functional layer above the first active layer 21 can protect the channel of the thin film transistor, preventing the first active layer 21 from being affected in the subsequent etching process.

In the array substrate shown in FIG. 4, the first active layer 21 and the second active layer 22 are located in the same layer, thereby facilitating thinning of the array substrate.

A light shielding layer is disposed between the substrate 10, and the first active layer 21 and the second active layer 22, and the light shielding layer includes a first light shielding portion 31 and a second light shielding portion 32. In particular, the orthographic projection of the first active layer 21 on the substrate 10 overlaps that of the first light shielding portion 31 on the substrate 10, and the orthographic projection of the second active layer 22 on the substrate 10 overlaps that of the second light shielding portion 32 on the substrate 10.

When the array substrate is applied in a display device with a backlight source, the first light shielding portion 31 and the second light shielding portion 32 can shield light from the backlight source to protect the first active layer 21 and the second active layer 22, respectively.

The first buffer layer 41 covers the first light shielding portion 31 and the second light shielding portion 32. The gate insulating layer 50 covers the first active layer 21 and the second active layer 22. In an exemplary embodiment, the gate insulating layer 50 may include at least two layers, one of which includes SiO$_2$ having a thickness of 50 to 200 nm, and the other includes SiN$_x$ having a thickness of 20 to 200 nm.

A first gate 51 and a second gate 52 are disposed on a side of the gate insulating layer 50 away from the substrate 10, and the materials forming the first gate 51 and the second gate 52 may be selected from one or more of Mo, an Mo/Nb alloy and an Mo/Al/Mo alloy. In an exemplary embodiment, the first gate 51 and the second gate 52 may have a thickness of 50-500 nm.

An interlayer dielectric layer 60 covers the first gate 51 and the second gate 52, and may include at least an SiN$_x$ layer having a thickness of 100-500 nm and an SiO$_2$ layer having a thickness of 100-500 nm.

A first source/drain 61 and a second source/drain 62 are disposed on a side of the interlayer dielectric layer 60 away from the substrate 10. The first source/drain 61 is connected to the first active layer 21 through a first via hole that penetrates the interlayer dielectric layer 60 and the gate insulating layer 50, and the second source/drain 62 is connected to the second active layer 22 through a second via hole that penetrates the interlayer dielectric layer 60 and the gate insulating layer 50. In an exemplary embodiment, the materials forming the first source/drain 61 and the second source/drain 62 may be selected from one or more of Ti and Al. For example, the first source/drain 61 and the second source/drain 62 may each include at least three layers, for example, one layer is Ti layer having a thickness of 30-300 nm, one layer is Al layer having a thickness of 100-600 nm, and another layer is Ti layer having a thickness of 30-300 nm. The first source/drain 61, the first gate 51 and the first active layer 21 constitute the first thin film transistor, and the second source/drain 62, the second gate 52 and the second active layer 22 constitute the second thin film transistor.

A planarization layer 71 covers the first source/drain 61 and the second source/drain 62. The planarization layer 71 may have a thickness of 500 to 5000 nm and may be made of a material such as an acrylic resin.

A common electrode 72 is disposed on the planarization layer 71. The common electrode 72 may have a thickness of 20 to 200 nm and may be made of a transparent conductive material such as ITO.

A passivation layer 73 covers the common electrode 72. The passivation layer 73 may have a thickness of 100 to 400 nm and may include SiN$_x$.

A pixel electrode 74 is disposed on the passivation layer 72, and the pixel electrode 74 is connected to the first source/drain 61 through a third via hole that penetrates the passivation layer 73 and the planarization layer 71. The pixel electrode 74 may have a thickness of 20 to 200 nm.

Figure 5:
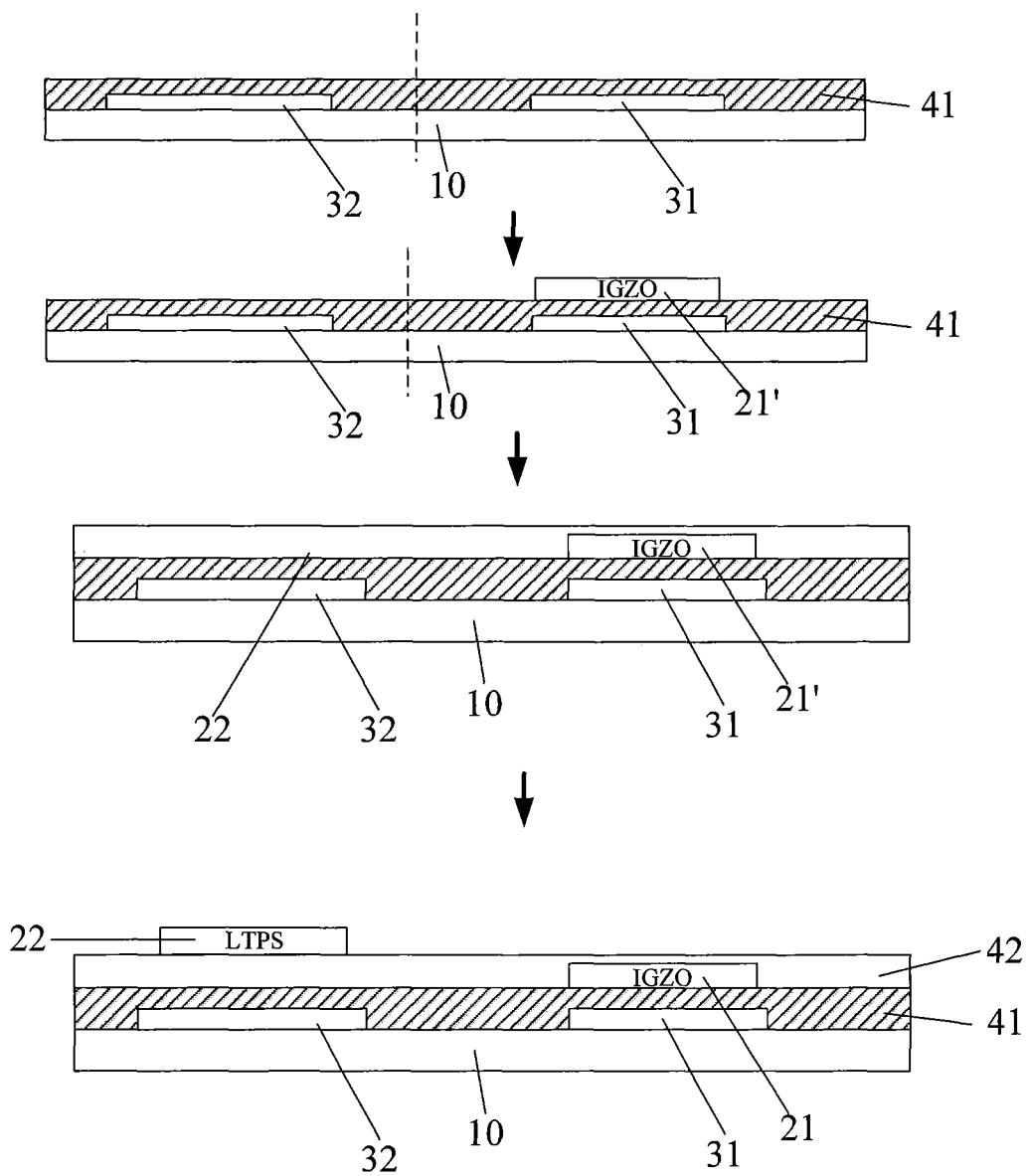
FIG. 5 is a schematic sectional view of an array substrate manufactured by the manufacturing method shown in FIG. 3.

FIG. 5 schematically shows steps of manufacturing method for an array substrate according to another embodiment of the present disclosure. As shown in FIG. 5, the manufacturing method is initially similar to the manufacturing method shown in FIG. 3. Firstly, a light shielding material is deposited on the substrate 10, which is patterned to form a first light shielding portion 31 and a second light shielding portion 32. The light shielding material may be an organic material that does not transmit light, or a metal or alloy that has high reflectivity and low transmittance, such as Al, Mo, Cu, a Cu/Al alloy, or the like. In some exemplary embodiments, the light shielding material may have a thickness of 20 to 200 nm. A buffer material is deposited on the first light shielding portion 31 and the second light shielding portion 32 to form a first buffer layer 41 covering the first light shielding portion 31 and the second light shielding portion 32. The buffer material may include SiN$_x$ or SiO$_2$, and the first buffer layer 41 may be of single layer structure or a multilayer structure. In some exemplary embodiments, the first buffer layer 41 may have a thickness of 20 to 200 nm. Particularly, the first light shielding portion 31 is located in the pixel area of the array substrate to be prepared, and the second light shielding portion 32 is located in the peripheral area of the array substrate to be prepared.

When the above array substrate is applied in a display device with a backlight source, the first light shielding portion 31 and the second light shielding portion 32 can shield light from the backlight source so as to prevent degradation of the active layer formed later due to illumination. However, as will be appreciated by those skilled in the art, the first light shielding portion 31 and the second light shielding portion 32 may be omitted in some embodiments.

Next, an IGZO material is deposited on the first buffer layer 41, which is subjected to patterning, channel doping and ion implantation to form a first semiconductor layer 21'. The first semiconductor layer 21' is located in the pixel area of the array substrate to be prepared. In some exemplary embodiments, the first semiconductor layer 21' may have a thickness of 20 to 200 nm.

Different from FIG. 3, a second buffer layer 42 covering the first semiconductor layer 21' and exposed portions of the first buffer layer 41 is then formed. In an exemplary embodiment, the second buffer layer 42 may include a SiO$_2$ layer having a thickness of 50-200 nm and a SiN$_x$ layer having a thickness of 20-200 nm on the SiO$_2$ layer. Since the IGZO in the first semiconductor layer 21' is a relatively sensitive material and susceptible to subsequent processes, the second buffer layer 42 is provided to sufficiently protect the IGZO in the first semiconductor layer 21'.

Then, a second active layer 22 is formed on the second buffer layer 42 and the first semiconductor layer 21' is subjected to an annealing process to form a first active layer 21. The second active layer 22 is located in the peripheral area of the array substrate to be prepared.

In an exemplary embodiment, the step of forming the second active layer 22 may specifically include firstly depositing amorphous silicon (a-Si) on the second buffer layer 42 to form a semiconductor material layer. The semiconductor material layer may have a thickness of 20-200 nm. Then, the semiconductor material layer is subjected to a dehydrogenation process and laser crystallization (ELA) to convert the a-Si in the semiconductor material layer into polysilicon (P-Si), thereby forming a second semiconductor layer. The second semiconductor layer is subjected to patterning, channel doping and ion implantation to form the second active layer 22.

If the semiconductor material layer is not subjected to a dehydrogenation process, the a-Si will instantaneously absorb a large amount of laser energy during laser crystallization. The laser energy will cause hydrogen contained in the a-Si to explode, which in turn results in ablation of the a-Si.

As will be appreciated by those skilled in the art, in embodiments of the present disclosure, it is also feasible to form P-Si by chemical vapor deposition or solid phase crystallization, etc.

Further, while the semiconductor material layer is subjected to a dehydrogenation process, an annealing process is performed on the first semiconductor layer 21' in the pixel area by the high temperature required by the dehydrogenation process to form the first active layer 21 that satisfies the performance requirements on a pixel TFT.

In the embodiments above, the first semiconductor layer 21' is formed prior to the second semiconductor layer, and the annealing process for the first semiconductor layer 21' is performed while the second semiconductor layer is subjected to high temperature dehydrogenation so as to form the first active layer 21. In this way, the annealing process for the first semiconductor layer 21' does not adversely affect the performance of the second semiconductor layer, which is advantageous to ensuring the channel doping effect of the second thin film transistor to be formed later. In an exemplary embodiment, high temperature dehydrogenation may be carried out at 350-650° C. for 20-60 minutes. After the dehydrogenation process, H content in the a-Si can be less than 2%.

Figure 6:
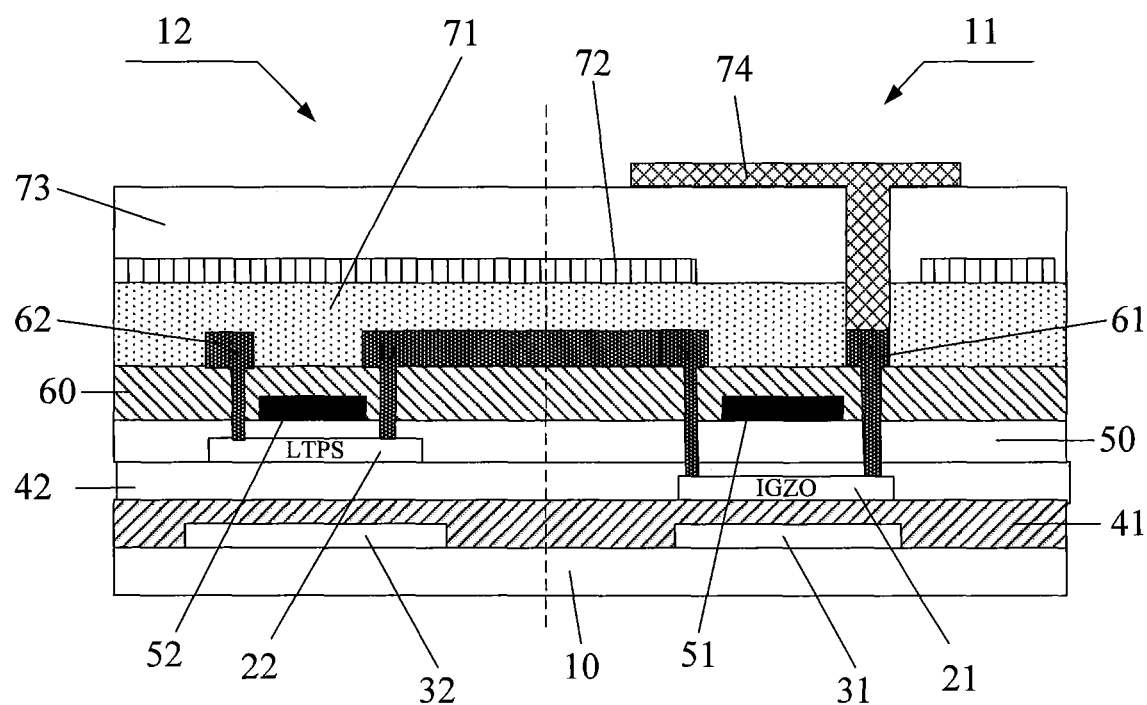
FIG. 6 is a schematic sectional view of an array substrate manufactured by the manufacturing method shown in FIG. 4.

FIG. 6 illustrates a schematic sectional view of an array substrate prepared by the manufacturing method shown in FIG. 5. As shown in FIG. 6, the prepared array substrate comprises a substrate 10, a first thin film transistor disposed in a pixel area 11 on the substrate 10, and a second thin film transistor disposed in a peripheral area 12 on the substrate 10. The first thin film transistor includes a first active layer 21 formed by an annealing process, and the second thin film transistor includes a second active layer 22 formed by a dehydrogenation process. The dehydrogenation process and the annealing process are performed simultaneously.

The array substrate includes two types of TFTs, in which a low-temperature polysilicon TFT (i.e., second thin film transistor) is disposed in the peripheral area 12, and an oxide TFT (i.e., first thin film transistor) is disposed in the pixel area 11. Since the annealing process for forming the first active layer 21 in the pixel area 11 is performed by the high temperature required in the dehydrogenation process for forming the second active layer 22 in the peripheral area 12, the annealing process does not adversely affect the performance of the second active layer 22.

Optionally, as shown in FIG. 6, the first thin film transistor in the pixel area 11 may be a top gate thin film transistor. The first active layer 21 of the top gate thin film transistor is closer to the substrate 10, so that the functional layer above the first active layer 21 can protect the channel of the thin film transistor, preventing the first active layer 21 from being affected in the subsequent etching process.

In the array substrate shown in FIG. 6, the first active layer 21 and the second active layer 22 are located in different layers, where a second buffer layer 42 is provided to sufficiently protect the IGZO in the first active layer 21.

A light shielding layer is disposed between the substrate 10, and the first active layer 21 and the second active layer 22, and the light shielding layer includes a first light shielding portion 31 and a second light shielding portion 32. In particular, the orthographic projection of the first active layer 21 on the substrate 10 overlaps that of the first light shielding portion 31 on the substrate 10, and the orthographic projection of the second active layer 22 on the substrate 10 overlaps that of the second light shielding portion 32 on the substrate 10.

When the array substrate is applied in a display device with a backlight source, the first light shielding portion 31 and the second light shielding portion 32 can shield light from the backlight source to protect the first active layer 21 and the second active layer 22, respectively.

A first buffer layer 41 covers the first light shielding portion 31 and the second light shielding portion 32. A gate insulating layer 50 covers the second active layer 22 and exposed portions of the second buffer layer 42. In an exemplary embodiment, the gate insulating layer 50 may include at least two layers, one of which includes $SiO_2$ layer having a thickness of 50 to 200 nm, and the other includes $SiN_x$ layer having a thickness of 20 to 200 nm.

A first gate 51 and a second gate 52 are disposed on a side of the gate insulating layer 50 away from the substrate 10, and the materials for forming the first gate 51 and the second gate 52 may be selected from one or more of Mo, an Mo/Nb alloy and an Mo/Al/Mo alloy. In an exemplary embodiment, the first gate 51 and the second gate 52 may have a thickness of 50-500 nm.

An interlayer dielectric layer 60 covers the first gate 51 and the second gate 52, and may include at least a $SiN_x$ layer having a thickness of 100-500 nm and a $SiO_2$ layer having a thickness of 100-500 nm.

A first source/drain 61 and a second source/drain 62 are disposed on a side of the interlayer dielectric layer 60 away from the substrate 10. The first source/drain 61 is connected to the first active layer 21 through a first via hole that penetrates the interlayer dielectric layer 60, the gate insulating layer 50, and the second buffer layer 42, and the second source/drain 62 is connected to the second active layer 22 through a second via hole that penetrates the interlayer dielectric layer 60 and the gate insulating layer 50. In an exemplary embodiment, the materials for forming the first source/drain 61 and the second source/drain 62 may be selected from one or more of Ti and Al. For example, the first source/drain 61 and the second source/drain 62 may each include at least three layers, for example, one layer is a Ti layer having a thickness of 30-300 nm, one layer is an Al layer having a thickness of 100-600 nm, and another layer is a Ti layer having a thickness of 30-300 nm.

A planarization layer 71 covers the first source/drain 61 and the second source/drain 62. The planarization layer 71 may have a thickness of 500 to 5000 nm and may be made of a material such as an acrylic resin.

A common electrode 72 is disposed on the planarization layer 71. The common electrode 72 may have a thickness of 20 to 200 nm and may be made of a transparent conductive material such as ITO or the like.

A passivation layer 73 covers the common electrode 72. The passivation layer 73 may have a thickness of 100 to 400 nm and may include $SiN_x$.

A pixel electrode 74 is disposed on the passivation layer 72, and the pixel electrode 74 is connected to the first source/drain 61 through a third via hole that penetrates the passivation layer 73 and the planarization layer 71. The pixel electrode 74 may have a thickness of 20 to 200 nm.

Apparently, many variations can be made to specific implementations of the embodiments described above. Those skilled in the art, with the teachings of the present disclosure, can adjust the materials and thicknesses of the layers as needed.

Another embodiment of the disclosure further provides a display panel comprising any of the array substrates described above.

Further, an embodiment of the disclosure provides a display device comprising the display panel described above. The display device may be any product or component having a display function, such as a liquid crystal display panel, an electronic paper, an OLED display panel, a mobile phone, a tablet computer, a television, a display, a notebook computer, a digital photo frame, a navigator, and the like.

It is to be understood that the above embodiments are merely exemplary embodiments for explaining the principle of the disclosure, but the disclosure is not so limited. Various modifications and improvements can be made by those ordinarily skilled in the art without departing from the spirit and essence of the disclosure, and such modifications and improvements are also regarded as falling within the scope of the present disclosure.

The invention claimed is:

1. A method for manufacturing an array substrate, comprising:
   forming a first thin film transistor in a pixel area on a substrate, wherein the forming the first thin film transistor comprises:
   forming a first semiconductor layer; and
      performing an annealing process on the first semiconductor layer to form a first active layer of the first thin film transistor;
   forming a second thin film transistor in a peripheral area on the substrate surrounding the pixel area, wherein the forming the second thin film transistor comprises:
   forming a semiconductor material layer;
   performing a dehydrogenation process on the semiconductor material layer to form a second semiconductor layer; and
   processing the second semiconductor layer to form a second active layer of the second thin film transistor,
   wherein the first semiconductor layer is formed prior to forming the second semiconductor layer, and
   wherein the dehydrogenation process and the annealing process are performed simultaneously.

2. The method for manufacturing the array substrate according to claim 1, wherein the processing the second semiconductor layer to form the second active layer of the second thin film transistor comprises:
   performing patterning, channel doping and ion implantation on the second semiconductor layer to form the second active layer of the second thin film transistor.

3. The method for manufacturing the array substrate according to claim 1, wherein prior to the forming the first semiconductor layer, the method further comprises:
   forming, on the substrate, a light shielding layer comprising a first light shielding portion and a second light shielding portion, an orthographic projection of the first active layer on the substrate overlapping an orthographic projection of the first light shielding portion on the substrate, and an orthographic projection of the second active layer on the substrate overlapping an orthographic projection of the second light shielding portion on the substrate; and
   forming a first buffer layer covering the light shielding layer.

4. The method for manufacturing the array substrate according to claim 1, further comprising:
   forming a second buffer layer covering the first semiconductor layer prior to forming the second semiconductor layer.

5. The method for manufacturing the array substrate according to claim 1, wherein after forming the second active layer, the method further comprises:
   forming a gate insulating layer covering the second active layer,
   forming a first gate and a second gate on the gate insulating layer, an orthographic projection of the first gate on the substrate overlapping an orthographic projection of the first active layer on the substrate, an orthographic projection of the second gate on the substrate overlapping an orthographic projection of the second active layer on the substrate, and
   forming an interlayer dielectric layer covering the first gate and the second gate.

6. The method for manufacturing the array substrate according to claim 5, wherein after the forming the interlayer dielectric layer, the method further comprises:
   forming a first source/drain and a second source/drain on the interlayer dielectric layer,
   wherein the first source/drain is connected to the first active layer through a first via hole, and
   wherein the second source/drain is connected to the second active layer through a second via hole.

7. The method for manufacturing the array substrate according to claim 6, further comprising:
   forming a planarization layer, a common electrode, a passivation layer, and a pixel electrode successively on the first source/drain and/or on the second source/drain.

8. The method for manufacturing the array substrate according to claim 1, wherein the first thin film transistor comprises a top gate type thin film transistor.

9. The method for manufacturing the array substrate according to claim 1, wherein the first active layer comprises an oxide semiconductor material, and the second active layer comprises low-temperature polysilicon.

10. An array substrate comprising:
    a substrate;
    a first thin film transistor in a pixel area on the substrate; and
    a second thin film transistor in a peripheral area on the substrate surrounding the pixel area,
    wherein the first thin film transistor comprises a first active layer formed using an annealing process,
    wherein the second thin film transistor comprises a second active layer formed using a dehydrogenation process, and
    wherein the dehydrogenation process and the annealing process are performed simultaneously,
    wherein the array substrate further comprises a light shielding layer between the substrate and the first active layer, wherein the light shielding layer comprises a first light shielding portion and a second light shielding portion, an orthographic projection of the first active layer on the substrate overlapping an orthographic projection of the first light shielding portion on the substrate, and an orthographic projection of the second active layer on the substrate overlapping an orthographic projection of the second light shielding portion on the substrate.

11. The array substrate according to claim 10, wherein the first active layer and the second active layer are located in a same layer.

12. The array substrate according to claim 10, further comprising:
    a first buffer layer between the light shielding layer and the first active layer.

13. A display panel comprising the array substrate according to claim 10.

14. A display device comprising the display panel according to claim 13.

15. An array substrate comprising:
    a substrate;
    a first thin film transistor in a pixel area on the substrate; and
    a second thin film transistor in a peripheral area on the substrate surrounding the pixel area,
    wherein the first thin film transistor comprises a first active layer formed using an annealing process,
    wherein the second thin film transistor comprises a second active layer formed using a dehydrogenation process, and
        wherein the dehydrogenation process and the annealing process are performed simultaneously,
    wherein the first active layer is closer to the substrate than the second active layer, and wherein the array substrate further comprises:
    a second buffer layer that is located between the first active layer and the second active layer and covers the first active layer.

16. The array substrate according to claim 15, further comprising:
    a gate insulating layer above the second active layer;
    a first gate and a second gate located on a side of the gate insulating layer away from the substrate, an orthographic projection of the first gate on the substrate overlapping an orthographic projection of the first active layer on the substrate, an orthographic projection of the second gate on the substrate overlapping an orthographic projection of the second active layer on the substrate;
    an interlayer dielectric layer covering the first gate and the second gate;
    a first source/drain and a second source/drain on the interlayer dielectric layer, wherein the first source/drain is connected to the first active layer through a first via hole, and wherein the second source/drain is connected to the second active layer through a second via hole; and
    a planarization layer, a common electrode, a passivation layer, and a pixel electrode disposed successively on the first source/drain and the second source/drain,
    wherein the pixel electrode is connected to the first source/drain through a third via hole.

* * * * *